US008699637B2

(12) United States Patent
Lee et al.

(10) Patent No.: US 8,699,637 B2
(45) Date of Patent: Apr. 15, 2014

(54) TIME DELAY ESTIMATION

(75) Inventors: Bowon Lee, Mountain View, CA (US); Ronald W Schafer, Mountain View, CA (US); Ton Kalker, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 229 days.

(21) Appl. No.: 13/204,042

(22) Filed: Aug. 5, 2011

(65) Prior Publication Data

US 2013/0034138 A1 Feb. 7, 2013

(51) Int. Cl.
*H03D 1/00* (2006.01)

(52) U.S. Cl.
USPC ........ 375/343; 375/224; 375/340; 455/456.1; 455/67.11

(58) Field of Classification Search
USPC ............... 375/343, 342, 224, 340; 455/456.1, 455/67.11
See application file for complete search history.

(56) References Cited

U.S. PATENT DOCUMENTS

| | | | |
|---|---|---|---|
| 5,473,759 A | 12/1995 | Slaney et al. | |
| 5,721,807 A | 2/1998 | Tschirk | |
| 6,804,167 B2 | 10/2004 | Scoca et al. | |
| 6,934,651 B2 * | 8/2005 | Smaragdis | 702/89 |
| 7,012,854 B1 * | 3/2006 | Lo | 367/135 |
| 7,593,738 B2 * | 9/2009 | Anderson | 455/456.1 |

FOREIGN PATENT DOCUMENTS

| | | |
|---|---|---|
| CN | 1212609 | 7/2005 |

OTHER PUBLICATIONS

Roman~Auditory-Based Algorithms for Sound Segregation in Multisource and Reverberant Environments~Disseration~The Ohio State University~2005~208 pages.

* cited by examiner

*Primary Examiner* — Eva Puente

(57) ABSTRACT

A method for time delay estimation performed by a physical computing system includes passing a first input signal obtained by a first sensor through a filter bank to form a first set of sub-band output signals, passing a second input signal obtained by a second sensor through the filter bank to form a second set of sub-band output signals, the second sensor placed a distance from the first sensor, computing cross-correlation data between the first set of sub-band output signals and the second set of sub-band output signals, and applying a time delay determination function to the cross-correlation to determine a time delay estimation.

20 Claims, 6 Drawing Sheets

TIME DELAY ESTIMATION

BACKGROUND

Time delay estimation is a signal processing technique that is used to estimate the time delay between two signals obtained from two different sensors that are physically displaced. For example, a microphone array includes a set of microphones spaced at particular distances from each other. Because sound does not travel instantaneously, a sound emanating from a source will reach some microphones before reaching others. Thus, the signal received by a microphone farther away from the source will be delayed from the signal received by a microphone that is closer to the source.

The signals received by each of the microphones can be analyzed to determine this time delay. Knowing the time delay can be useful for a variety of applications including source localization and beamforming. The time delay is often estimated using a process referred to as a Generalized Cross-Correlation Phase Transform (GCC-PHAT). This method performs satisfactorily with low and moderate levels of background noise. However, this method does not do well with larger levels of background noise or moderate reverberation.

BRIEF DESCRIPTION OF THE DRAWINGS

The accompanying drawings illustrate various examples of the principles described herein and are a part of the specification. The drawings are merely examples and do not limit the scope of the claims.

Throughout the drawings, identical reference numbers designate similar, but not necessarily identical, elements.

DETAILED DESCRIPTION

Figure 1:
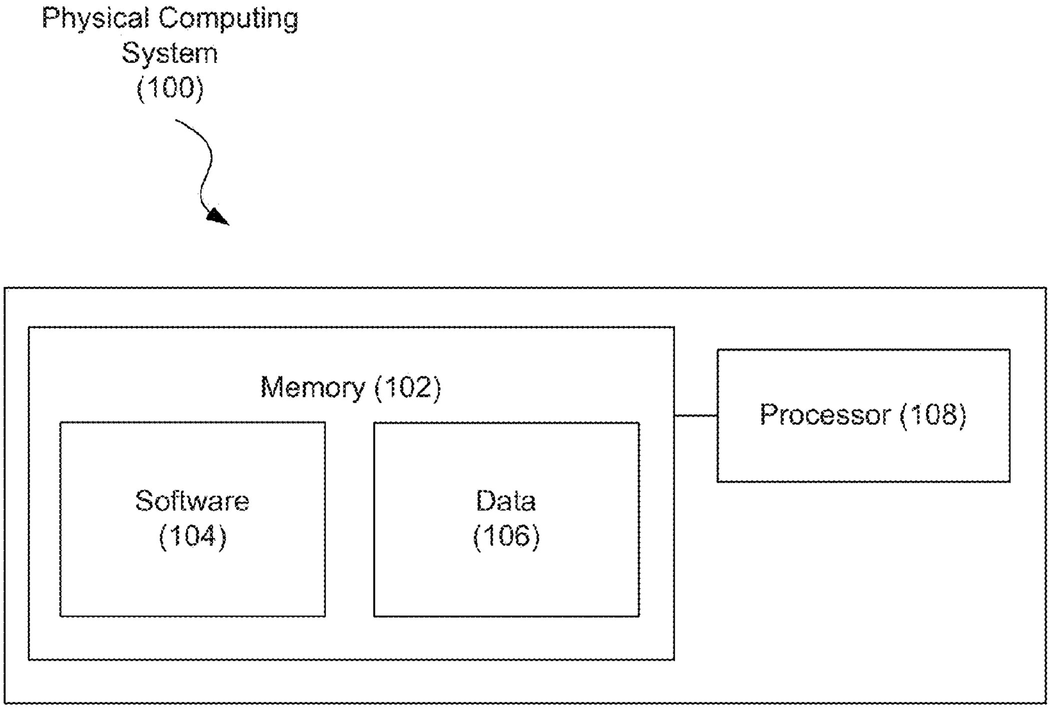
FIG. 1 is a diagram showing an illustrative physical computing system, according to one example of principles described herein.

As mentioned above, the signals received by each of the microphones within a microphone array can be analyzed to determine the time delay difference between signals in the array. The time delay can be estimated using a process referred to as a Generalized Cross-Correlation Phase Transform (GCC-PHAT). This method performs satisfactorily with low and moderate levels of background noise. However, this method does not do well with larger levels of background noise or moderate levels of reverberation. While many functions for determining time delay estimation have difficulty with large amounts of background noise, humans are capable of processing time delays for purposes of source localization even with high levels of background noise.

In light of this and other issues, the present specification discloses a method for time delay estimation that does perform well even with high levels of background noise. The methods and systems described herein include similarities to the manner in which the human ear processes speech signals. Specifically, the methods and systems described herein include similarities to a cochlear signal processing model.

According to certain illustrative examples, the sampled signals received from two different sensors are each sent through a filter bank. A filter bank is a set of band-pass filters that divide a signal into a number of frequency sub-signals, each sub-signal representing a sub-band frequency of the input signal. Thus, the set of sub-band outputs of a filter bank corresponds to the input signal at a different frequency. The first signal received by the first sensor is fed through the filter bank to produce a first set of sub-band outputs and the second signal received by the second sensor is fed through the filter bank to produce a second set of sub-band outputs.

A cross-correlation is then computed between the first and second sets of sub-band outputs. A cross-correlation is a measure of similarity between two signals as a function of a time delay between those signals. This set of cross-correlations for the entire set of sub-band signals can be represented as a correlogram. A correlogram is defined as a two-dimensional plot of the set of cross-correlations and can be used to visually identify time delays in two signals.

Using this cross-correlation data, a function can be applied that determines the time delay between the two signals. For example, the cross-correlation data may be normalized. Then, the cross-correlation may be integrated across all frequency sub-band outputs for each time delay. The time delay corresponding to the maximum point along this integration can then be defined as the time delay estimate.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Throughout this specification and in the appended claims, the term "signal processing system" is to be broadly interpreted as any set of hardware and, in some cases, software or firmware that is capable of performing signal processing techniques described herein. For example, a signal processing system may be a set of analog-to-digital circuitry and other hardware designed specifically for performing time delay estimation. Alternatively, a signal processing system may be a generic processor-based physical computing system.

Referring now to the figures, FIG. 1 is a diagram showing an illustrative physical computing system (100) that can be used to process signals received from sensors such as microphone arrays. According to certain illustrative examples, the physical computing system (100) includes a memory (102) having software (104) and data (106) stored thereon. The physical computing system (100) also includes a processor (108).

Many types of memory are available. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various forms of memory may store information in the form of software (104) and data (106).

The physical computing system (100) also includes a processor (108) for executing the software (104) and using or updating the data (106) stored in memory (102). The software (104) may include an operating system. An operating system allows other applications to interact properly with the hardware of the physical computing system. Such other applications may include a signal processing application that can process digitized discrete time signals obtained from various types of sensors.

Figure 2:
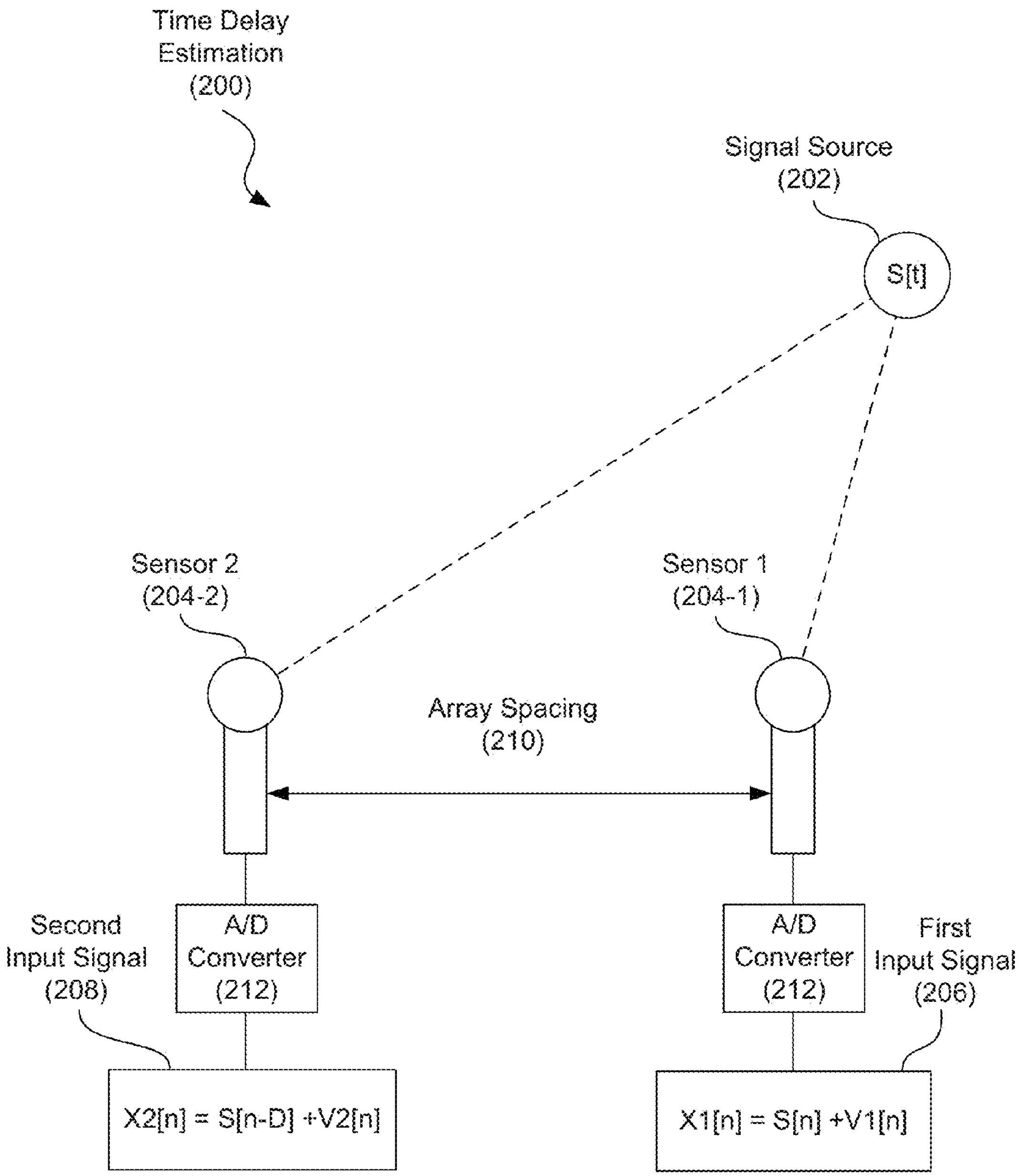
FIG. 2 is a diagram showing illustrative time delay estimation, according to one example of principles described herein.

FIG. 2 is a diagram showing illustrative time delay estimation (200). Although the methods and systems embodying principles described herein may apply to a variety of signal types such as electromagnetic radiation and sound, the examples herein will relate to sound and speech applications. According to certain illustrative examples, two sensors (204-1, 204-2) are placed at a distance from each other. This distance is determined by the array spacing (210). In this example, the sensors are microphones. A signal source (202) is placed at some distance from the sensors. In this example, the signal source is a sound source such as a person speaking.

Real signals are typically represented in continuous time. The signal source is represented as S(t). Upon being sampled and quantized, the source signal can be represented using discrete time. A discrete time signal is one which takes on a value at discrete intervals in time. This is opposed to a continuous time signal where time is represented as a continuum. In the case of a discrete time signal, the variable 'n' is used to denote the discrete intervals in time. Thus, a signal x[n] refers to the value of a signal at a reference point along the discrete time space that is indexed by n.

Discrete-time signals are obtained from continuous-time signals such as speech by quantizing the time samples of the signal. In other words, x[n]=x(n/Fs) where Fs is the sampling frequency. This digitization can be performed by an analog-to-digital converter (212). For example, the microphone may be configured to sample the signal level at each discrete time interval and store that sample as a digital value. The frequency at which the real analog signal is sampled is referred to as the sampling frequency. The time between samples is referred to as the sampling period. For example, a microphone may sample a signal every 50 microseconds (μs). In the case that a time delay is 170 μs, then such a time delay may be rounded to four sampling periods (4×50 μs=200 μs). Thus, the resolution of the time delay depends inversely on the sampling frequency.

The signal obtained by the first sensor (204-1) is referred to as the first input signal (206). This input signal is represented as a discrete time signal of X1[n] which is equal to S[n]+V1[n]. V1[n] indicates the noise and reverberation picked up by sensor 1. The signal obtained by the second sensor (204-2) is referred to as the second input signal (208). This signal is represented as the discrete time signal X2[n] which is equal to S[n−D]+V2[n]. V2[n] is the noise picked up by sensor 2 (204-2). D represents the time delay between the two signals X1 [n] and X2[n]. The time delay D is represented in sampling periods. If the signal source (202) were closest to the second sensor (204-2), then the time delay between the two signals X1[n] and X2[n] will be negative.

The maximum possible time delay would be the case where the signal source (202) is located along a straight line drawn between the two sensors (204). This is referred to as an end-fire position. The maximum time delay will be referred to as $D_{MAX}$. At this point, the time delay can be defined as d*Fs/c where d is the distance between the two sensors, Fs is the sampling frequency, and c is the speed at which the signal travels. In the case of a speech signal, c is the speed of sound.

The smallest possible time delay is when the source is located along a straight line drawn through the midpoint between the two sensors, the line being perpendicular to a line between the two sensors. This is referred to as the broadside position. A signal from a source along this line will reach both sensors at the same time and thus there will be no time delay (D=0).

Figure 3:
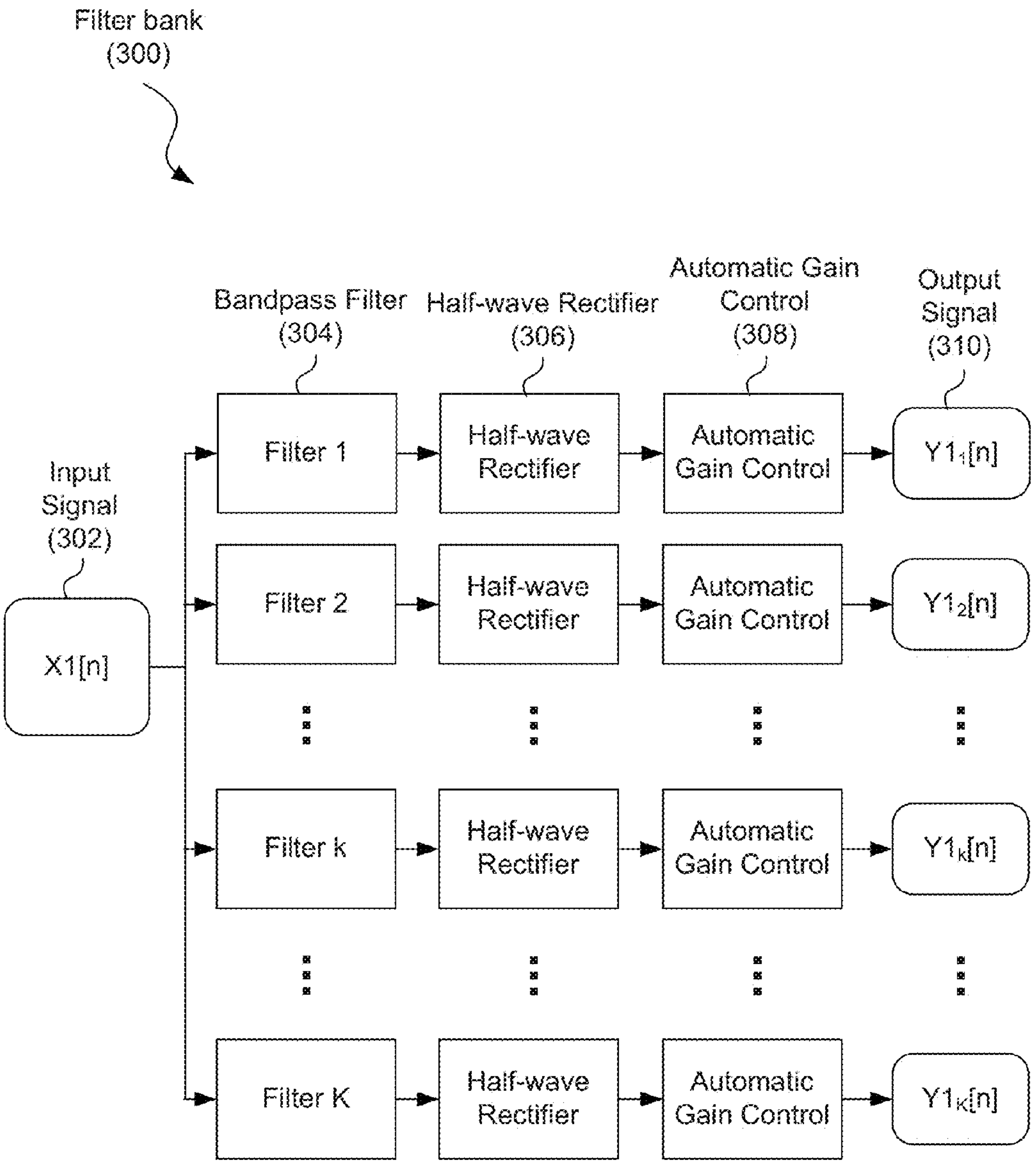
FIG. 3 is a diagram showing an illustrative filter bank, according to one example of principles described herein.

FIG. 3 is a diagram showing an illustrative filter bank (300). According to certain illustrative examples, the filter bank (300) includes a number of band-pass filters (304). Attached to each band-pass filter is a half-wave rectifier (306) and an automatic gain control (308). The filter bank is designed to take an input signal (302) and produce a set of sub-band output signals, each sub-band signal representing a different frequency range of the input signal (302).

A band-pass filter (304) is a system that is designed to let signals at a particular frequency range pass while blocking signals at all other frequencies. In the filter bank (300), each band-pass filter is designed to allow a different range of frequencies to pass while blocking all other frequency ranges. One example of such a filter is a gammatone filter. A gammatone filter is a linear filter described by an impulse response that is the product of a gamma distribution and sinusoidal tone. A gamma distribution is a two-parameter family of continuous probability distributions.

In one example, a filter bank (300) may divide an input signal into 80 different sub-band output signals, each sub-band being of a different frequency range. If a gammatone filter bank is used to model human hearing, then each sub-band can be constructed in such a way that uses Equivalent Rectangular Bandwidth (ERB) as nonlinear spacing of the frequency range. Together, each sub-band frequency includes the frequency spectrum of the input signal (302) that is relevant for analysis.

The filter bank system if FIG. 3 is based on a model for the processing that occurs in the peripheral auditory system. The use of such a filter bank analysis leads to a time delay estimation system that is more robust to noise and reverberation distortions than the commonly used GCC-PHAT system.

After a particular sub-band signal has been filtered from the input signal (302), then that sub-band signal may be sent to an output. Alternatively, that sub-band signal may be further processed before being sent to an output. One type of processing that may be further applied to a sub-band signal is a half-wave rectifier (306). A half-wave rectifier (306) is designed to let positive signals pass while blocking negative signals. Alternatively, the half-wave rectifier may let signals above a predefined threshold value pass while blocking signals below a predefined threshold value.

A further type of processing that may be performed on a sub-band signal is an automatic gain control process. An automatic gain control (308) includes a feedback loop where the average signal value over a particular period of time is fed back into the input of the automatic gain control. This can be used to smooth out any unwanted spikes or noise within the sub-band signal.

After passing through any other processing systems, the sub-band signal will be put out as an output signal. In the case that the input signal (302) is the first input signal X1[n] (e.g.

206, FIG. 2), then the set of output signals (310) can be denoted as $\{Y1_1[n], Y1_2[n] \ldots Y1_k[n]\ Y1_K[n]\}$, where k indexes the sub-band output signals from the filter bank (300) output and K is the total number of sub-band output signals output from the filter bank. In the case where the input signal (302) is the second input signal (e.g. 208, FIG. 2), then the set of output signals (310) can be denoted as $\{Y2_1[n], Y2_2[n] \ldots Y2_k[n] \ldots Y2_K[n]\}$.

The time delay between the two sets of outputs can be determined by computing a cross-correlation between the output signals at each filter bank output. A cross-correlation measures the similarity between two signals by computing a value that is a function of the time delay between the two signals. This value indicates how similar the two signals are at a particular time delay. This value is highest when the signals are most similar at a particular time delay. Conversely, this value is lowest when the two signals are most dissimilar at a particular time delay. According to certain illustrative examples the cross correlation between two input signals can be computed as follows:

$$C_k[T] = \sum_{n=(m-1)L+1}^{mL} Y1_k[n+T]Y2_k[n] \quad \text{(Equation 1)}$$

Where:

$C_k[T]$=the cross-correlation value for a pair of filter bank outputs;

k=the index for the filter bank outputs;

m=the frame index

L=the frame length $Y1_k[n]$=the filter bank output from a first input signal indexed by k;

$Y2_k[n]$=the filter bank output from a second input signal indexed by k; and

T=time lag.

The cross-correlation is performed over a time frame having a length of a certain number of sample periods. These frames are indexed by the variable 'm'. The total number of sampling periods within a time frame is indicated by 'L'. For example, a cross-correlation may be performed over a length of 256 sampling periods. The range over which the cross-correlation is computed may be limited to the range of possible time delay. For example, the cross-correlation may be computed over a set of sample periods that range between $-D_{MAX}$ and $D_{MAX}$. For example, if $D_{MAX}$ is 15 sample periods, then the cross-correlation should be computed between time delays ranging between −15 sampling periods and 15 sampling periods. The total length of such a time frame is 31 sampling periods.

Figure 4A:
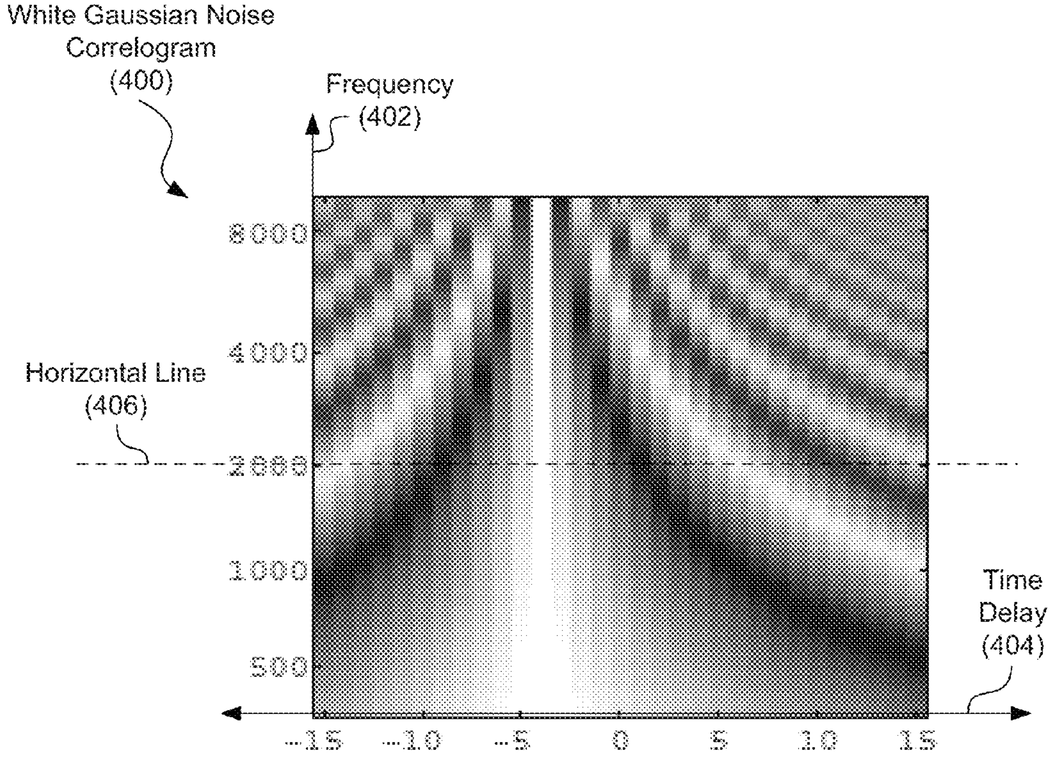
FIG. 4A is a diagram showing an illustrative correlogram for a white Gaussian noise signal, according to one example of principles described herein.

FIG. 4A is a diagram showing an illustrative correlogram (400) for a white Gaussian noise signal having time delay of 4 samples. A correlogram is a plot of a set of cross-correlations between filter bank outputs of two input signals. The vertical axis represents frequency (402). The horizontal axis represents the time delay ranging between −15 sample periods and 15 sample periods. Each different horizontal line throughout the correlogram represents the cross-correlation between two signals over the time delay range at a frequency of one of the filter bank outputs. For example, the horizontal line (406) illustrates the cross-correlation between sub-band outputs of inputs signals over the given time range at 2000 Hz.

The darker sections represent low values of the cross-correlation and the lighter sections represent higher values of the cross-correlation. As can be seen, there is a vertical white line at a time delay of four sample periods. This indicates that across all frequencies, there is a high correlation between the two signals at a time delay of four sample periods. Thus, the time delay can be determined by viewing the correlogram. However, a signal processing system may apply a function to the cross-correlation data to determine the time delay estimate without actually having to plot the correlogram and display that correlogram to a human user.

Figure 4B:
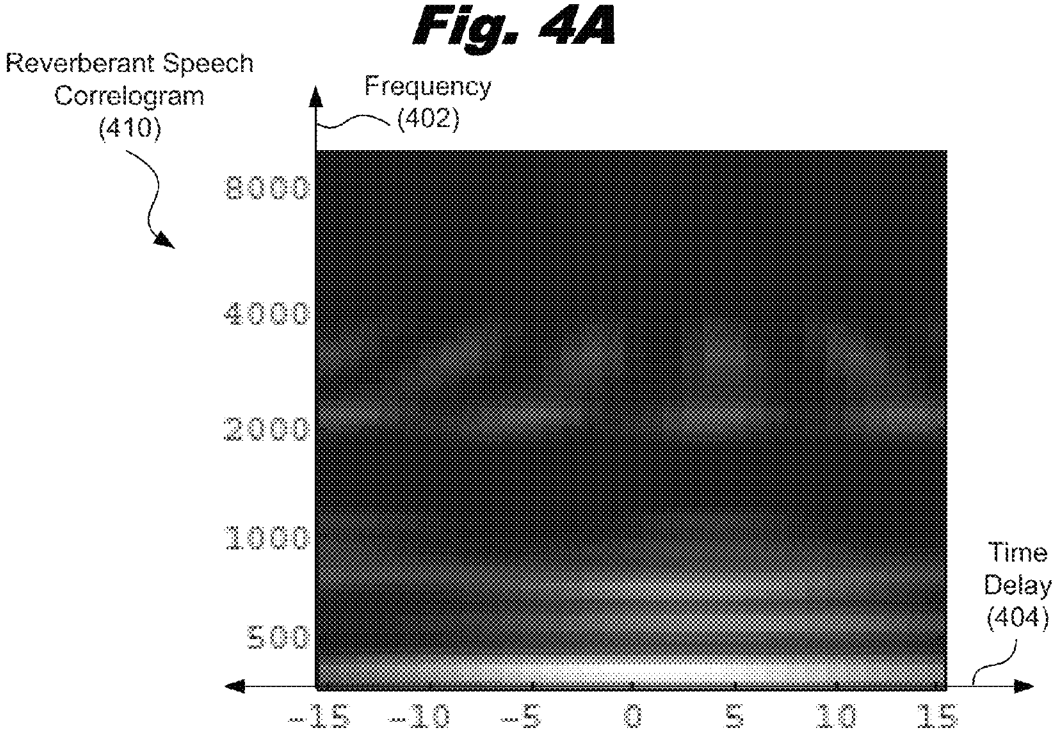
FIG. 4B is a diagram showing an illustrative correlogram for a speech signal with reverberation, according to one example of principles described herein.

FIG. 4B is a diagram showing an illustrative reverberant speech correlogram (410). The speech signal has a reverberation time of T60 (approximately 0.6 seconds). Although the time delay can be visually identified for the cross-correlation of a clean speech signal, the correlogram (410) for a cross-correlation of a speech signal with reverberation is more difficult to identify. As can be seen from FIG. 4B, there is much dark color (meaning low correlation) throughout the correlogram and there is not a readily identifiable vertical white line. In order to find a better estimate of the time delay between two signals, a various functions can be applied to the cross-correlation data to better condition the cross-correlation data for analysis.

In this case, the cross-correlation data can be conditioned so that the time delay can more readily be determined. One way to condition the cross-correlation data is to normalize it. A normalization process can be applied by using the following equation:

$$N_k[T] = \frac{C_k[T]}{\mathrm{MAX}_{T\in\{-D_{MAX},D_{MAX}\}}\{C_k[T]\}} \quad \text{(Equation 2)}$$

Where:

$N_k[T]$=the normalized cross-correlation data from the filter bank output referenced by k;

$C_k[T]$=the cross-correlation data from the filter bank output referenced by k; and $\mathrm{MAX}_{T\in\{-Dmax,\ Dmax\}}\{C_k[T]\}$=The maximum value of the kth filter bank output over the time delay range.

This normalization process sets the maximum value of each horizontal line to 1.

Figure 5A:
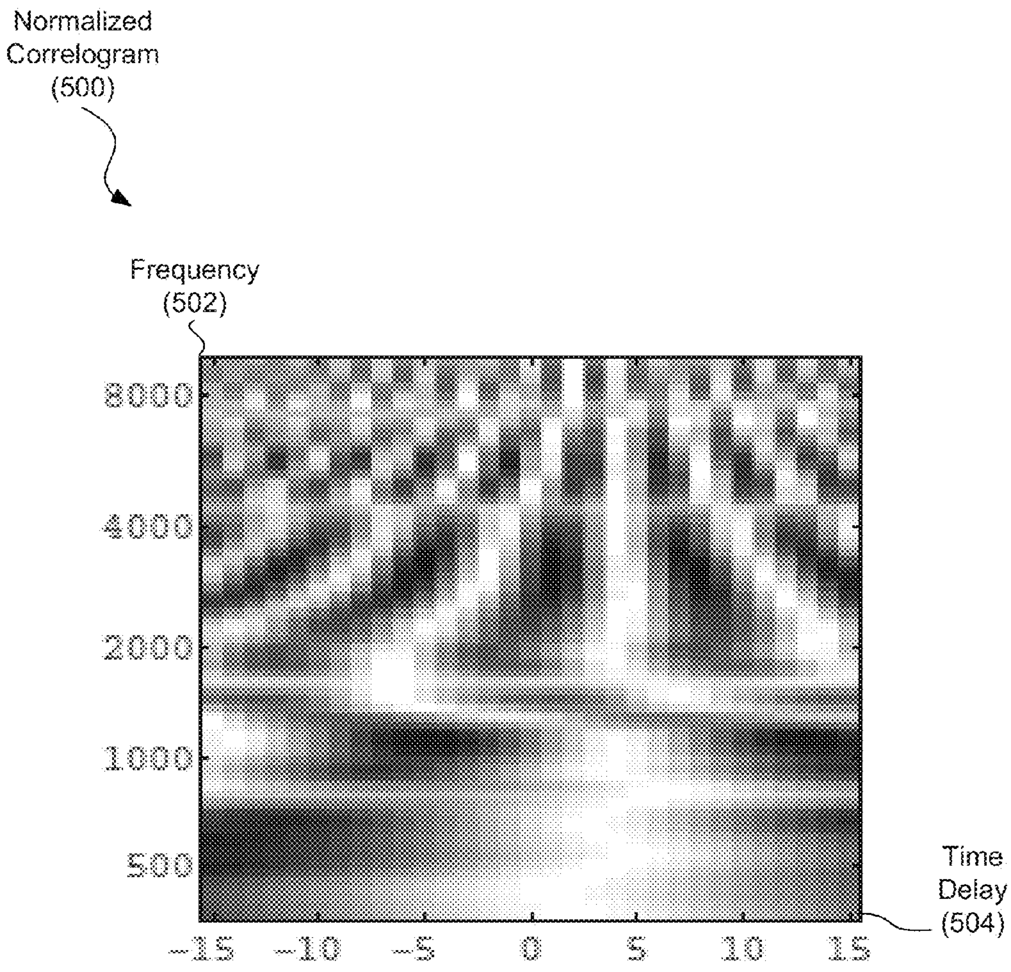
FIG. 5A is a diagram showing an illustrative normalized correlogram, according to one example of principles described herein.

FIG. 5A is a diagram showing an illustrative normalized correlogram (500). Again, the vertical axis represents frequency (502) and the horizontal axis represents the time delay (504). As can be seen from the correlogram (500) for the normalized cross-correlation data, there are more white sections. This is because the correlation data for each filter bank output has been normalized over the time delay range. Thus, each horizontal line will have at least some point where there is a whitest color.

Although there is a more distinct line at a time delay of four sampling periods, the line is not quit distinct. One way to determine a distinct line would be to integrate the data over each time delay sampling period. The peak of that integration will indicate which time delay sampling period has the most white sections across the entire frequency spectrum. This integration may be performed using the following equation:

$$C[T] = \sum_{k=1}^{K} N_k[T] \quad \text{(Equation 3)}$$

Where:

C[T]=the integration of the normalized cross-correlation data at a particular time delay T;

$N_k[T]$ is the normalized cross-correlation data at an indexed filter bank output;

k=the filter bank index; and

K=the total number of filter bank outputs.

Figure 5B:
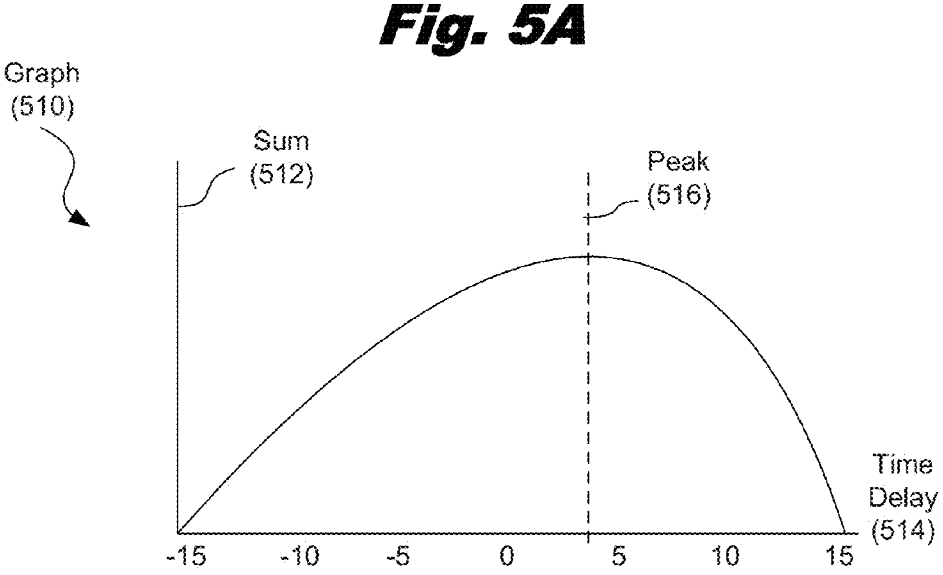
FIG. 5B is a diagram showing an illustrative graph of an integrated correlogram, according to one example of principles described herein.

FIG. 5B is a diagram showing an illustrative graph (510) of integrated cross-correlation data. The horizontal axis represents the time delay (514) and the vertical axis represents the sum (512) of the normalized values at a particular time delay. According to certain illustrative examples, the sum values will peak (516) at a particular point along the time delay range. This point represents the time delay at which there is the strongest correlation between the two signals. Thus, the peak is used to determine the time delay between the two input signals from the two different sensors.

The process of normalizing the cross-correlation data and integrating that normalized data is one example of a function that can be applied to the cross-correlation data to determine the time delay. Other functions which can be used to determine the strongest point of correlation as a function of time delay across the relevant frequency spectrum may be used as well.

Figure 6:
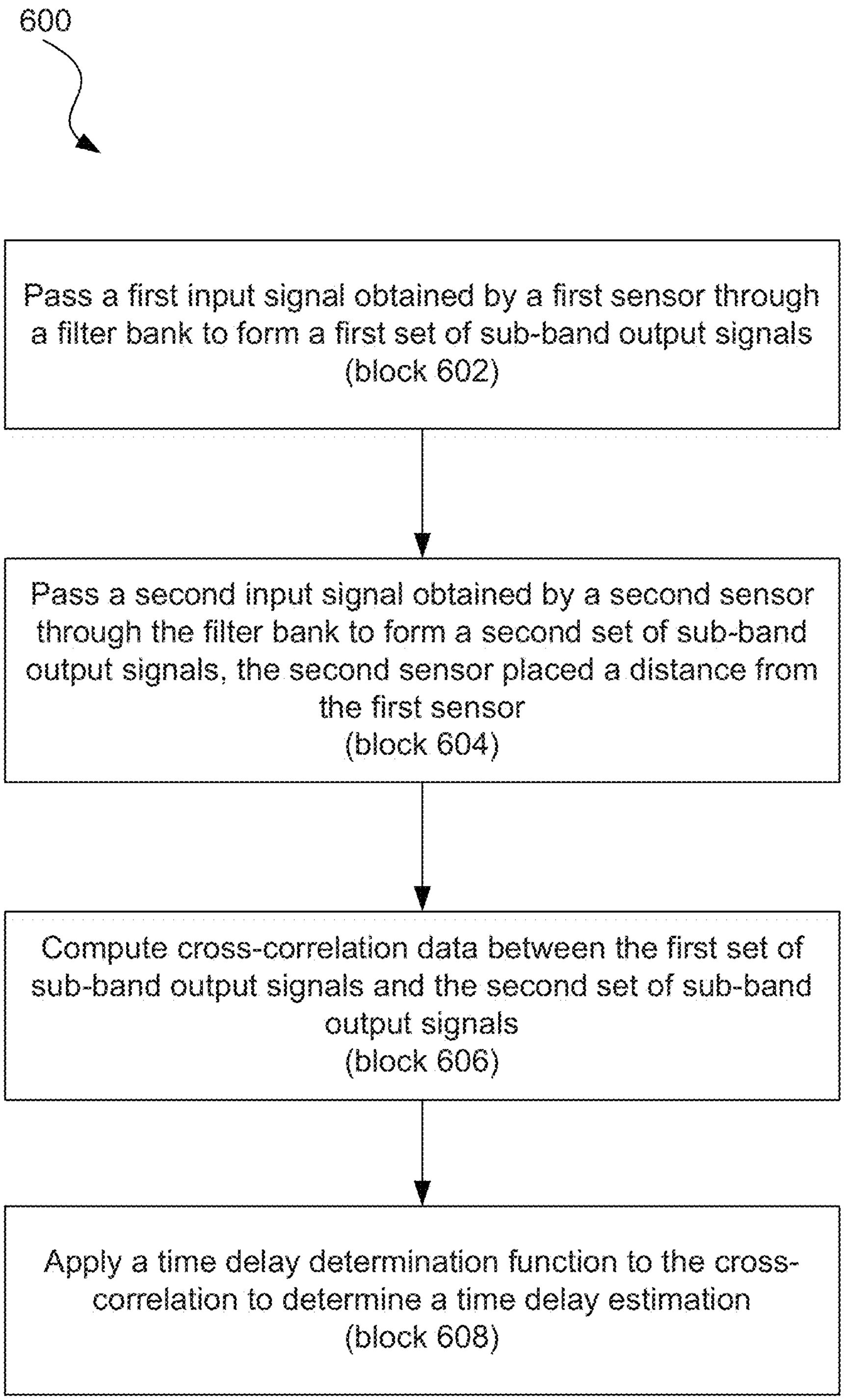
FIG. 6 is a flowchart showing an illustrative method for time delay estimation, according to one example of principles described herein.

FIG. 6 is a flowchart showing an illustrative method for time delay estimation. According to certain illustrative examples, the method includes passing (block 602) a first input signal obtained by a first sensor through a filter bank to form a first set of sub-band output signals, passing (block 604) a second input signal obtained by a second sensor through the filter bank to form a second set of sub-band output signals, the second sensor placed a distance from the first sensor, computing (block 606) cross-correlation data between the first set of sub-band output signals and the second set of sub-band output signals, and applying (block 608) a time delay determination function to the cross-correlation to determine a time delay estimation.

In conclusion, through use of methods and systems embodying principles described herein, a more robust time delay estimate between two signals obtained by two sensors can be achieved despite background noise and reverberation. Such time delay estimates may be used for a variety of applications such as source localization and beamforming.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A method for time delay estimation performed by a physical computing system, the method comprising:

passing a first input signal obtained by a first sensor through a filter bank to form a first set of sub-band output signals;

passing a second input signal obtained by a second sensor through said filter bank to form a second set of sub-band output signals, said second sensor placed a distance from said first sensor;

computing cross-correlation data between said first set of sub-band output signals and said second set of sub-band output signals; and applying a time delay determination function to said cross-correlation data to determine a time delay estimation.

2. The method of claim 1, wherein applying said time delay determination function comprises normalizing said cross-correlation data.

3. The method of claim 1, wherein an output of a band-pass filter of said filter bank is processed by a half-wave rectifier system.

4. The method of claim 1, wherein an output of a band-pass filter of said filter bank is processed by an automatic gain control system.

5. The method of claim 1, wherein filters of said filter bank comprise gammatone filters.

6. The method of claim 1, further comprising, plotting a correlogram of said cross-correlation data.

7. The method of claim 1, wherein each sub-band signal represents a different frequency range within a frequency range of the corresponding input signal.

8. The method of claim 1, wherein each set of sub-band output signals comprises 80 different sub-band output signals.

9. The method of claim 2, wherein applying said time delay determination function comprises integrating said cross-correlation data and defining said time delay estimation where this integration has a maximum point.

10. The method of claim 7, further comprising using Equivalent Rectangular Bandwidth as nonlinear spacing the frequency ranges of the sub-band signals.

11. A signal processing system comprising:

at least one processor;

a memory communicatively coupled to the at least one processor, the memory comprising computer executable code that, when executed by the at least one processor, causes the at least one processor to:

pass a first input signal obtained by a first sensor through a filter bank to form a first set of sub-band output signals;

pass a second input signal obtained by a second sensor through said filter bank to form a second set of sub-band output signals, said second sensor placed a distance from said first sensor;

compute cross-correlation data between said first set of sub-band output signals and said second set of sub-band output signals; and apply a time delay determination function to said cross-correlation to determine a time delay estimation.

12. The system of claim 11, wherein to apply said time delay determination function, said processor is to normalize said cross-correlation data for each sub-band output separately.

13. The system of claim 11, wherein to apply said time delay determination function, said processor is to:

integrate said cross-correlation data; and define said time delay estimation where this integration has a maximum point.

14. The system of claim 11, wherein an output of a band-pass filter of said filter bank is processed by a half-wave rectifier system.

15. The system of claim 11, wherein an output of a band-pass filter of said filter bank is processed by an automatic gain control system.

16. The system of claim 11, wherein filters of said filter bank comprise gammatone filters.

17. The system of claim 11, further comprising, plotting a correlogram of said cross-correlation data.

18. The system of claim 11, wherein each sub-band signal represents a different frequency range within a frequency range of the corresponding input signal.

19. The system of claim 18, wherein frequency ranges of the sub-band signal are non-linearly spaced using Equivalent Rectangular Bandwidth.

20. A method for time delay estimation performed by a physical computing system, the method comprising:

passing a first input signal obtained by a first sensor through a filter bank to form a first set of sub-band output signals;

passing a second input signal obtained by a second sensor through said filter bank to form a second set of sub-band output signals, said second sensor placed a distance from said first sensor;

computing cross-correlation data between said first set of sub-band output signals and said second set of sub-band output signals; and determining a time delay estimate from said cross correlation data by:

normalizing said cross-correlation data; and determining a maximum point of an integration of said cross-correlation data.

* * * * *